US011335548B2

(12) United States Patent
Suzuki (10) Patent No.: US 11,335,548 B2
(45) Date of Patent: May 17, 2022

(54) EXPOSURE APPARATUS AND ARTICLE MANUFACTURING METHOD

(71) Applicant: CANON KABUSHIKI KAISHA, Tokyo (JP)

(72) Inventor: Kohei Suzuki, Tokyo (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 17/324,390

(22) Filed: May 19, 2021

(65) Prior Publication Data

US 2021/0366702 A1    Nov. 25, 2021

(30) Foreign Application Priority Data

May 25, 2020   (JP) .............................. JP2020-090470

(51) Int. Cl.
*H01J 61/52* (2006.01)
*G03F 7/20* (2006.01)

(52) U.S. Cl.
CPC ........ *H01J 61/523* (2013.01); *G03F 7/70016* (2013.01); *G03F 7/70825* (2013.01); *G03F 7/70858* (2013.01)

(58) Field of Classification Search
CPC ............. G03F 7/70016; G03F 7/70825; G03F 7/70858; G03F 7/70891; H01J 61/523; H01J 61/526
USPC ........... 313/11, 35, 36; 315/112; 355/30, 67; 362/294, 373
See application file for complete search history.

(56) References Cited

U.S. PATENT DOCUMENTS

| | | | |
|---|---|---|---|
| 3,346,751 A * | 10/1967 | Lienhard ............... | H01J 61/361 313/32 |
| 4,785,216 A * | 11/1988 | Roberts .................. | F21V 29/30 313/113 |
| 5,493,168 A * | 2/1996 | Seedorf ................. | H01J 61/523 313/11 |
| 6,703,769 B2 | 3/2004 | Yamane | |
| 6,759,793 B2 * | 7/2004 | Narita ..................... | F21V 29/02 313/13 |
| 2010/0118287 A1 * | 5/2010 | Kikuchi ................... | H01J 5/62 355/69 |

FOREIGN PATENT DOCUMENTS

JP   2001216938 A   8/2001
JP   2019204748 A   11/2019

* cited by examiner

*Primary Examiner* — Hung V Nguyen
(74) *Attorney, Agent, or Firm* — Rossi, Kimms & McDowell LLP (57) ABSTRACT

An exposure apparatus comprising a holding part for holding an electric discharge lamp, the electric discharge lamp includes an electric discharge tube which covers an electric discharge space in which a pair of electrodes are disposed to face each other, a socket provided on one end of the electric discharge tube, a metal member which guides one of the pair of electrodes into the socket, wherein an opening for ventilation is provided in a bottom of the socket, the holding part includes a ventilation pipe to form a path for ventilation through the opening in the bottom of the socket, and a cooling part for cooling the metal member by supplying a cooling medium to the metal member through the ventilation pipe.

11 Claims, 6 Drawing Sheets

EXPOSURE APPARATUS AND ARTICLE MANUFACTURING METHOD

BACKGROUND OF THE INVENTION

Field of the Invention

The present invention relates to an exposure apparatus or the like which can hold an electric discharge lamp.

Description of the Related Art

As one of apparatuses utilized in manufacturing processes (lithography processes) for semiconductor devices and the like, there is an exposure apparatus configured to expose a substrate to light.

An exposure apparatus can transfer a pattern formed in a mask to a photosensitive material (a resist) on a substrate by projecting an image of the pattern of the mask onto the photosensitive material on the substrate through a projection optical system.

In exposure apparatuses, for example, when a substrate (a photosensitive material) has to be exposed to light (an i-ray) having a wavelength of 365 nm, mercury lamps are utilized as light sources.

Mercury lamps have a structure in which a pair of electrodes are arranged facing each other in a glass tube made of quartz glass in which mercury is sealed and sealing tubes are connected on both sides of the glass tube.

Inside the sealing tubes, end portions of electrodes and metal members which can take a shape such as that of a foil are electrically connected or metal parts which are electrically connected to these metal members are connected to base parts as a socket outside of the sealing tubes.

As a result, it is possible to electrically connect the base parts outside of the quartz glass tubes to the electrodes inside of the quartz glass tubes through the metal members.

Metal members are used for electrically connecting the insides of quartz glass tubes to the outsides of the tubes while maintaining airtight states in quartz glass tubes.

To be specific, although columnar sealing glass bodies having sizes that are substantially the same as those of inner diameters of the sealing tubes are included between the insides of the glass tubes and outside of these tubes, metal members are disposed to be arranged between the sealing tubes and the sealing glass bodies.

Incidentally, when mercury lamps in exposure apparatuses are lit, the temperature thereof becomes extremely high, the temperature of metal members made of molybdenum or the like also increase and the metal members may become deformed, and air may enters gaps therein so that the metal members oxidize.

The lifespan of mercury lamps may be decreased due to poor electrical connection due to such oxidation, damage to quartz glass due to thermal expansion, and melting of metal members due to abnormal generation of heat in some cases.

In response of this problem, Japanese Patent Laid-Open No. 2001-216938 describes an example in which the inside of a base part (an end portion of a sealing tube) is cooled. In addition, a first opening for ventilation is formed in a circumferential surface of the base part and a second opening for ventilation is also formed in a tail end surface (a bottom surface) of the base part to form a flow path for a cooling gas. Furthermore, the purpose of this is to minimize increase in temperature by flowing a cooling gas in the vicinity of an end portion of a sealing tube, minimize oxidation of a metal member, and extend the lifespan of a mercury lamp.

However, in the case of the configuration of Japanese Patent Laid-Open No. 2001-216938, it is difficult for a cooling gas to flow in through an opening part in a circumferential surface (a side surface) and a cooling efficiency is poor.

To be specific, a cooling nozzle needs to be disposed in the vicinity of an opening in a circumferential surface, but the nozzle needs to be made of metal because an atmosphere reaches a high temperature.

In the case of a metal, there is a risk concerning dielectric breakdown between the nozzle and a lamp electrode. Thus, the nozzle cannot be located close to the lamp electrode.

As a result, the cooling gas may have to be blown from a distance in some cases and the cooling gas may not be able to be sent efficiently to the opening part in the circumferential surface.

On the other hand, although the cooling efficiency can be improved when the cooling gas is introduced from a bottom surface and discharged from a side surface, there are then the following problems.

One of the problems is that it may not be possible to directly aim at a part needing to be cooled the most at the end portion of the sealing tube.

It is difficult to control a flow of air because the structure allows the air to flow out from the side surface. As a result, there is a risk that desired cooling may not be able to be achieved.

Another problem is that there is a risk that fragments or the like of a sealing agent (an adhesive) generated in the sealing tube will scatter in the lamp housing. Certain materials such as an adhesive for sealing are utilized in the sealing tube, and fragments of the materials may fall off due to various factors during use in some cases.

When the cooling gas leaks from the side surface of the base part, there is a risk of the cooling gas flowing out of the lamp within a flow of air and sticking to an outer surface of glass of a lamp, a mirror, or the like at high temperatures.

Also, Japanese Patent Laid-Open No. 2019-204748 describes a configuration in which an air supply opening and an air discharge opening are provided in a holding part on an exposure apparatus side and cooling is performed by injecting a cooling medium (a cooling gas) into the base part through the opening of the mercury lamp on the base part side.

However, in the configuration of Japanese Patent Laid-Open No. 2019-204748, if the positions of the air supplying opening and the air exhausting opening in the holding part on the exposure apparatus side and the opening of the mercury lamp on the base part side are not accurately aligned, there is a problem that a sufficient amount of cooling medium may not be able to be injected and cooling may be insufficient. For this reason, a separate alignment mechanism is provided to align the positions of the exposure apparatus and the mercury lamp.

However, in this case, it is necessary to provide mechanisms for alignment on the holding part side of the exposure apparatus and the base part side of the mercury lamp, which not only complicates the configuration and increases the difficulty in design, but increases the costs associated with the exposure apparatus, and the costs associated with the mercury lamp will increase in some cases.

In view of the above description, an object of the present invention is to provide an exposure apparatus having a high cooling efficiency.

SUMMARY OF THE INVENTION

An object of the present invention is to provide an exposure apparatus comprising a holding part configured to hold an electric discharge lamp, wherein the electric discharge lamp includes an electric discharge tube which covers an electric discharge space in which a pair of electrodes are disposed to face each other, a socket provided on at least one end portion side of the electric discharge tube, a metal member which guides at least one of the pair of electrodes into the socket, wherein an opening for ventilation is provided in a bottom surface of the socket on an end portion side, wherein the holding part includes a ventilation pipe having a protrusion-shape, and the ventilation pipe is configured to form a path for ventilation through the opening in the bottom surface of the socket and to be inserted into the socket in a state in which the holding part holds the electric discharge lamp, and wherein the exposure apparatus includes a cooling part which cools the metal member by supplying a cooling medium to the metal member in the socket through the ventilation pipe.

Further features of the present invention will become apparent from the following description of exemplary embodiments with reference to the attached drawings.

DESCRIPTION OF THE EMBODIMENTS

Hereinafter, with reference to the accompanying drawings, favorable embodiments of the present invention will be described using Examples. In each diagram, the same reference signs are applied to the same members or elements, and duplicate description will be omitted or simplified.

An exposure apparatus 100 in an embodiment according to the present invention will be described with reference to FIG. 1.

Figure 1:
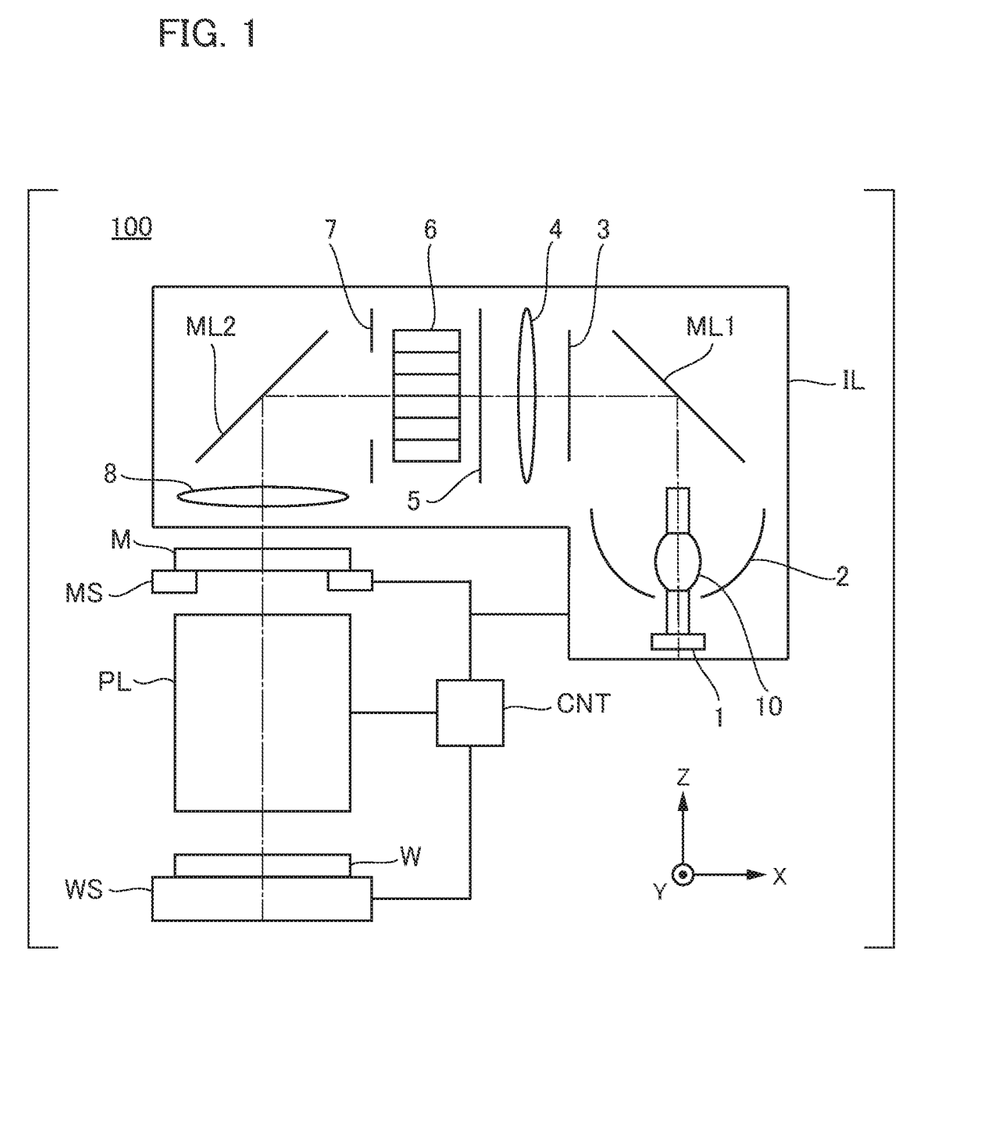
FIG. 1 is a schematic diagram illustrating a configuration of an exposure apparatus 100 in an embodiment of the present invention.

FIG. 1 is a schematic diagram illustrating a configuration of the exposure apparatus 100 in the embodiment.

The exposure apparatus 100 in the embodiment includes, for example, an illumination optical system IL, a mask stage MS configured to configured to hold a mask M (a reticle), a projection optical system PL, a substrate stage WS configured to hold a substrate W (a wafer), and a control unit CNT.

Also, the exposure apparatus 100 performs a process of exposing the substrate W to light by projecting an image of a pattern of the mask M onto a substrate (an exposure process).

The illumination optical system IL illuminates the mask M held using the mask stage MS.

The projection optical system PL has a prescribed projection magnification and projects the pattern of the mask M onto the substrate W. Furthermore, the control unit CNT is configured of, for example, a computer including a CPU, a memory, and the like and controls each unit of the exposure apparatus 100 on the basis of a computer program stored in the memory to perform an exposure process.

A configuration of the illumination optical system IL will be described below.

The illumination optical system IL includes, for example, a holding part 1 (a holding apparatus) configured to hold a lamp 10, a concave surface mirror 2, a flat surface mirror ML1, an ND filter 3, a condenser lens 4, a wavelength filter 5, a fly eye lens 6, a masking blade 7, a flat surface mirror ML2, and a lens 8. The holding part 1 holds the lamp 10 configured to emit, for example, light such as an i-ray.

Although an example in which an electric discharge lamp such as a mercury lamp is used as the lamp 10 will be described in this embodiment, an electric discharge lamp other than the mercury lamp may be used as the lamp 10.

Light emitted from the lamp 10 held using the holding part 1 is collected using the concave surface mirror 2, reflected using the flat surface mirror ML1, has a light intensity adjusted using the ND filter 3, collected using the condenser lens 4, and then incident on the wavelength filter 5.

Light having a wavelength within a desired range is transmitted through the wavelength filter 5.

Light transmitted through the wavelength filter 5 has a light intensity distribution uniformized using the fly eye lens 6 and is illuminated to the mask M through the masking blade 7, the flat surface mirror ML2, and the lens 8.

The lamp 10 which is a light emitting source in the illumination optical system IL configured in this way is a consumable component and needs to be replaced with a new lamp regularly. It takes a certain amount of time to replace the lamp 10 with a new lamp, an operation of the apparatus may stop during that time in some cases, and the yield is reduced. Thus, a longer lifespan is desired.

Before a configuration for realizing a long lifespan in this embodiment is explained, first, a general configuration of the lamp will be described with reference to FIG. 2.

Figure 2:
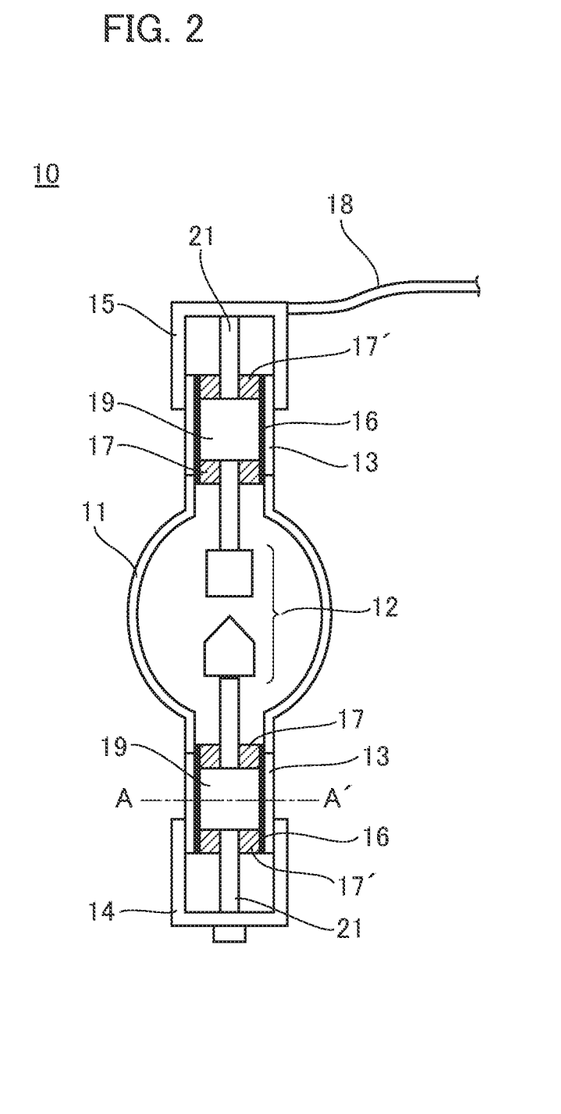
FIG. 2 is a schematic diagram of a lamp 10 in the related art.

FIG. 2 is a schematic diagram of the (mercury) lamp 10 in the related art.

A glass tube 11 made of quartz glass or the like as a substantially spherical electric discharge tube covers an electric discharge space in which a pair of electrodes 12 are disposed to face each other and light is emitted when a high voltage is applied to the pair of facing electrodes 12.

Also, the glass tube 11 has two ends having tubular sealing parts 13 configured to be connected to a first base part 14 and a second base part 15 provided on both end sides of the glass tube 11.

Furthermore, the first base part 14 and the second base part 15, both of which function as sockets, are fitted onto the tubular sealing parts 13 at both ends of the glass tube 11 and the sealing parts 13 at both ends are disposed to be arranged therebetween at the top and the bottom (in ±Z directions) in FIG. 2.

Each electrode of the pair of electrodes 12 passes through one of metal electrode core wire holding body 17 and is electrically connected to each of a plurality of thin metal members 16 made of molybdenum or the like.

The thin metal members 16 are disposed to be arranged between a substantially columnar sealing glass body 19 configured to seal the inside of the glass tube and an inner side of each of the tubular sealing parts 13.

Also, the metal members 16 pass through the metal electrode core wire holding bodies 17' and are electrically connected to the base parts 14 and 15 through metal lead rods 21 or the like. That is to say, each of the metal members 16 is disposed so that at least one electrode of the pair of electrodes are guided into the base part.

Thus, the external base parts 14 and 15 and the pair of internal electrodes 12 are electrically connected to each other without impairing the airtightness in the glass tube 11. Although the base parts are provided at both ends of the electric discharge tube in the embodiment, the base part may be provided only at one end, the metal members may be disposed so that the pair of electrodes are guided to one base part separately, and they may be disposed in the base part to be electrically insulated and separated.

The disposition of the sealing glass body 19 and the metal members 16 will be described with reference to FIG. 3.

Figure 3:
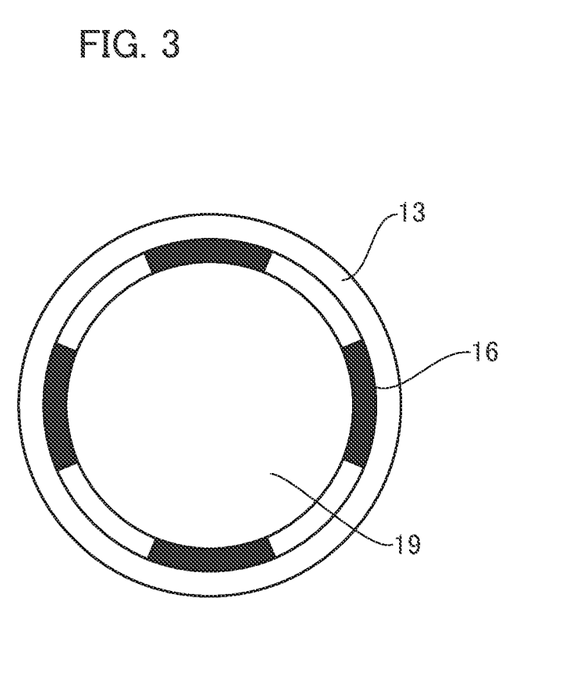
FIG. 3 is a cross-sectional view taken along A-A' of FIG. 2.

FIG. 3 is a cross-sectional view taken along A-A' of FIG. 2.

In FIG. 3, the plurality of thin metal members 16 are disposed along the circumference of the sealing glass body 19 to be arranged between an inner surface of the tubular sealing part 13 and an outer circumferential surface of the sealing glass body 19.

Since a gap is formed in a portion in which there is no metal member 16, a gap is mainly filled with a sealing agent (an adhesive).

There are multiple factors which determine the lifespan of this lamp such as distortion and dirt on the glass tube and deformation of a shape of a distal end of the electrode. However, it was confirmed that, in a large proportion of cases, the tubular sealing part 13 deforms due to a temperature rise in the vicinity of the metal member, air flows in from the gap, the resistance increases due to the oxidation of the metal member, and fusion cutting occurs due to the occurrence of abnormal generation of heat.

For this reason, in this embodiment, the cooling efficiency in the vicinity of the metal electrode core wire holding bodies 17' increases and a temperature rise is minimized to achieve a longer lifespan. In addition, a configuration in which the scattering of fragments of a sealing agent (an adhesive) or the like can be also minimized is provided.

A configuration of the exposure apparatus side in this embodiment for that purpose will be described with reference to FIG. 4.

Figure 4:
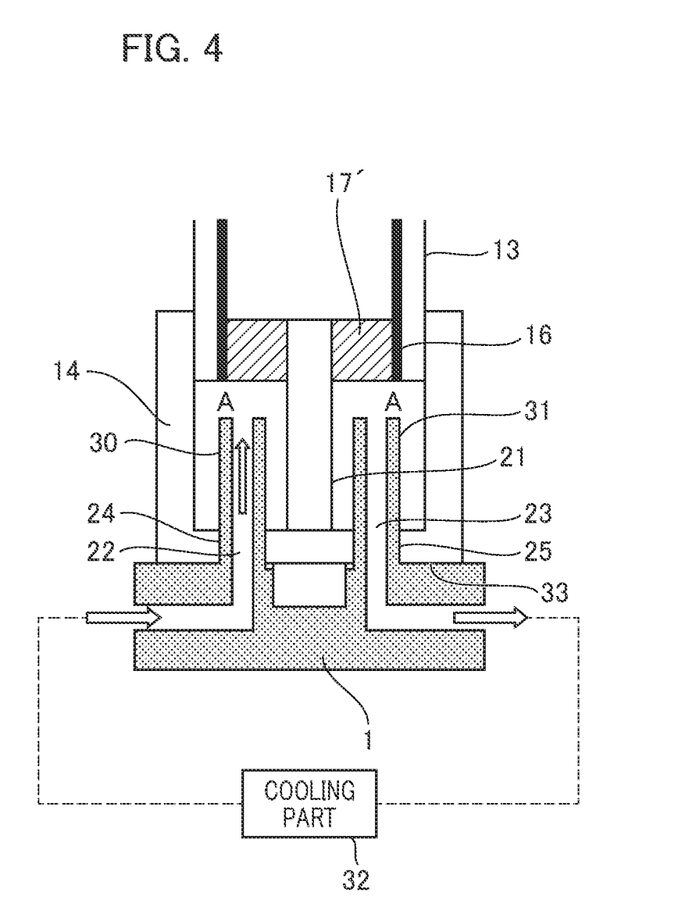
FIG. 4 is a diagram illustrating a state in which a mercury lamp in the embodiment is installed in a holding part 1.

FIG. 4 is a diagram illustrating a state in which the mercury lamp is installed in the holding part 1. If the lamp is installed in the holding part 1, each of the metal lead rods 21 of the lamp comes into contact with an opposing portion of the holding part 1 which is made of a metal to provide electrical conduction. In the embodiment, since the base part and the lead rods 21 are electrically conductive, an electrical contact (not shown) of the holding part and the base part may come into contact with each other to establish electrical conduction.

As illustrated in FIG. 4, a configuration in which a plurality of ventilation openings 24 and 25 are provided in a bottom surface 33 at a lower end portion of the first base part 14 of the mercury lamp and the cooling part 32 cools the metal member using a cooling gas through openings 22 and 23 on the holding part 1 side is provided.

Moreover, when shapes of the openings 22 and 23 on the holding part side are provided to have a protrusion-shaped ventilation pipe protruding into the base part, a protrusion-shaped air supply ventilation pipe 30 and a protrusion-shaped air exhaust ventilation pipe 31 are formed.

Also, a configuration in which, in a state in which the holding part holds the electric discharge lamp, the air supply ventilation pipe 30 or the air exhaust ventilation pipe 31 passes through the openings 24 and 25 for ventilation in the bottom surface of the base part and is inserted into the base part is provided.

Furthermore, in a state in which the holding part holds the electric discharge lamp, the openings of the air supply ventilation pipe are arranged to face the vicinity of the metal member 16 in the base part.

In addition, the cooling part 32 directly or indirectly supplies a cooling medium (a cooling gas) into the base part by supplying air or exhausting air using the air supply ventilation pipe 30 or the air exhaust ventilation pipe 31, thereby cooling the metal member.

In this way, in this embodiment, the air supply for cooling can be guided to the metal members 16 which are a cooling point in a pinpoint manner. Thus, cooling efficiency is significantly improved.

Here, diameters of the openings 24 and 25 for ventilation provided in a bottom surface of the first base part 14 are set to be slightly larger than outer diameters of the protrusion-shaped ventilation pipes 30 and 31. Furthermore, when the first base part 14 is installed in the holding part 1, for example, the first base part 14 is pushed into the holding part in a downward side in FIG. 4, the ventilation pipes 30 and 31 are configured to fit into the openings 24 and 25. Thus, the lamps are configured to be aligned (positioned) in a circumferential or radial direction at the same time.

Here, the alignment (positioning) may allow a prescribed deviation.

Each of the lamps may be configured to be positioned at a prescribed position through bayonet joining by pushing the first base part 14 into the holding part in a downward side in FIG. 4 and then slightly rotating the first base part 14 in a prescribed direction.

Figure 5:
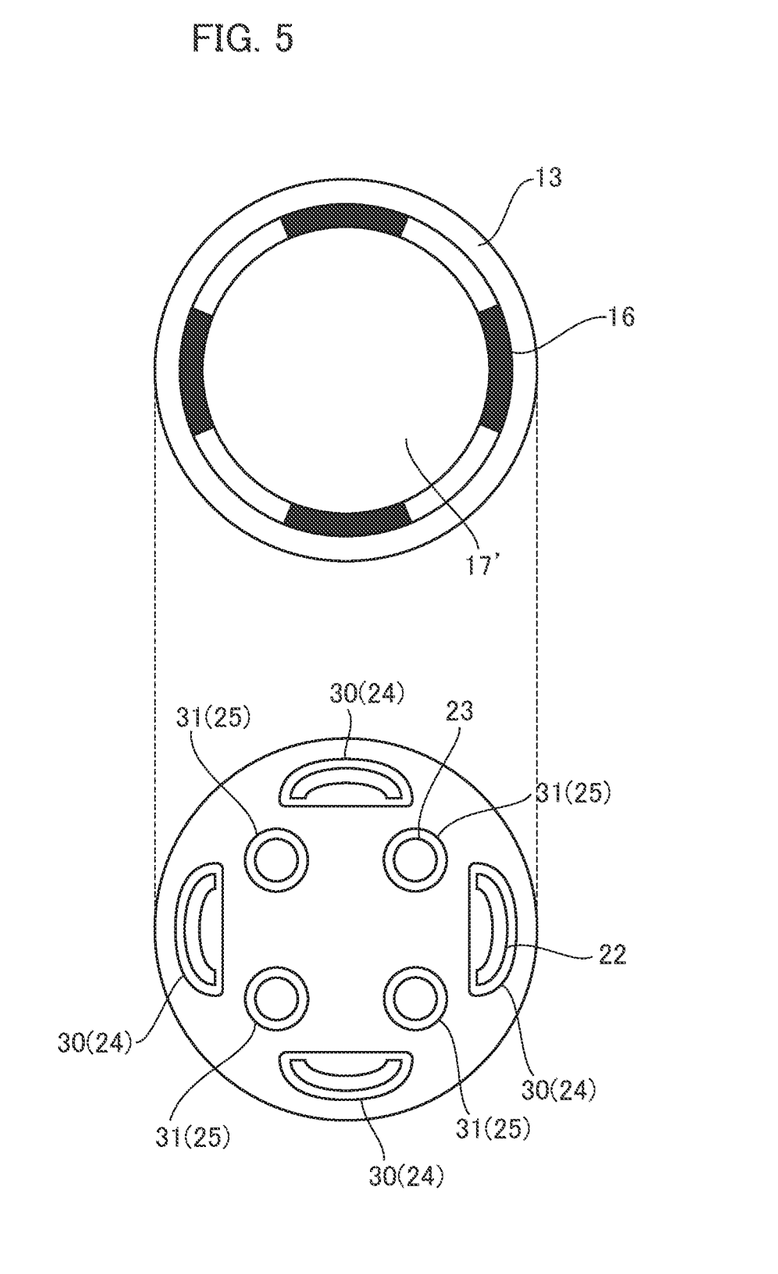
FIG. 5 is a diagram illustrating a relationship among an opening of a bottom surface of a base part, a metal member 16, and a ventilation pipe in the embodiment.

FIG. 5 is a diagram illustrating a position relationship between the opening in the bottom surface of the base part, the metal member 16, and the ventilation pipe in the embodiment. The upper diagram of FIG. 5 illustrates the vicinity of a lower end surface of the electrode core wire holding body 17' of FIG. 4.

The opening 22 of the air supply ventilation pipe 30 is disposed at a position near a portion substantially opposite to the metal member 16 in a circumferential direction inside the base part.

Also, the opening 23 of the air exhaust ventilation pipe 31 is configured to be arranged further inward than the opening 22 of the air supply ventilation pipe 30 in the base part. With such a configuration, a region A near the metal member 16 to be cooled the most can be efficiently cooled in a pinpoint manner.

In FIG. 5, also in this embodiment, the metal member 16 is disposed in the circumferential direction inside the base part and the air supply opening 22 has an elongated shape in which the air supply opening 22 follows a shape of the end portion of the metal member 16.

Moreover, since the air supply opening 22 of the same number as metal members 16 are provided to face each of the metal members 16, the cooling effect is further enhanced.

On the other hand, a shape of the air exhaust opening 23 is substantially circular to obtain an exhaust effect in an uniform direction. Moreover, as illustrated in FIG. 5, the air exhaust opening 23 is arranged inside the air supply opening 22. Therefore, a gas flow between the supply air and the exhaust air becomes smooth and the cooling efficiency is high.

Instead of directly spraying a cooling gas at the end portion of the metal member 16, a cooling gas may be sprayed on the circumferential portion of the metal electrode core wire holding body 17 near the metal member 16.

As described above, the metal member 16 is used to establish electrical conduction between the inside of the quartz glass tube and the outside of the tube and is disposed between the sealing part 13 and the sealing glass body 19.

That is to say, although the metal member 16 may be located in a position in which the metal member 16 is disposed in a closed space so that directly spraying a cooling medium (a cooling gas) to the metal member 16 is difficult in many cases, it is possible to efficiently cool the metal member 16 if the configuration of this embodiment is utilized. As described above, it has been confirmed that a sufficient cooling effect can be obtained simply by spraying a cooling medium in the vicinity of the metal member 16 without directly spraying the cooling medium onto the metal member 16.

With the above configuration, it is possible to obtain an exposure apparatus having extremely high cooling efficiency with less scattering of fragments of a sealing agent (an adhesive) or the like. In this embodiment, as illustrated in FIG. 5, four air supply ventilation pipes 30 having an elongated air supply opening 22 along the circumference and four air exhaust ventilation pipes 31 having a round exhaust opening 23 are disposed. However, the number and shape are not limited to the configuration of this embodiment as long as the region A can be cooled efficiently.

That is to say, it is desirable that the ventilation pipes have different shapes and numbers depending on the characteristics of the electric discharge tube lamp to be installed and the shape of the base part and the like.

Also, in FIG. 5, the shapes of the four pairs of air supply ventilation pipes 30 and the openings 24 of the base part are all the same and the shapes of the four pairs of air exhaust ventilation pipes 31 and the openings 25 of the base part are all the same. However, the shape of any one pair may be different from the shape of the other pair so that the shape can be positioned in accordance with a specific phase in the circumferential direction.

Figure 6:
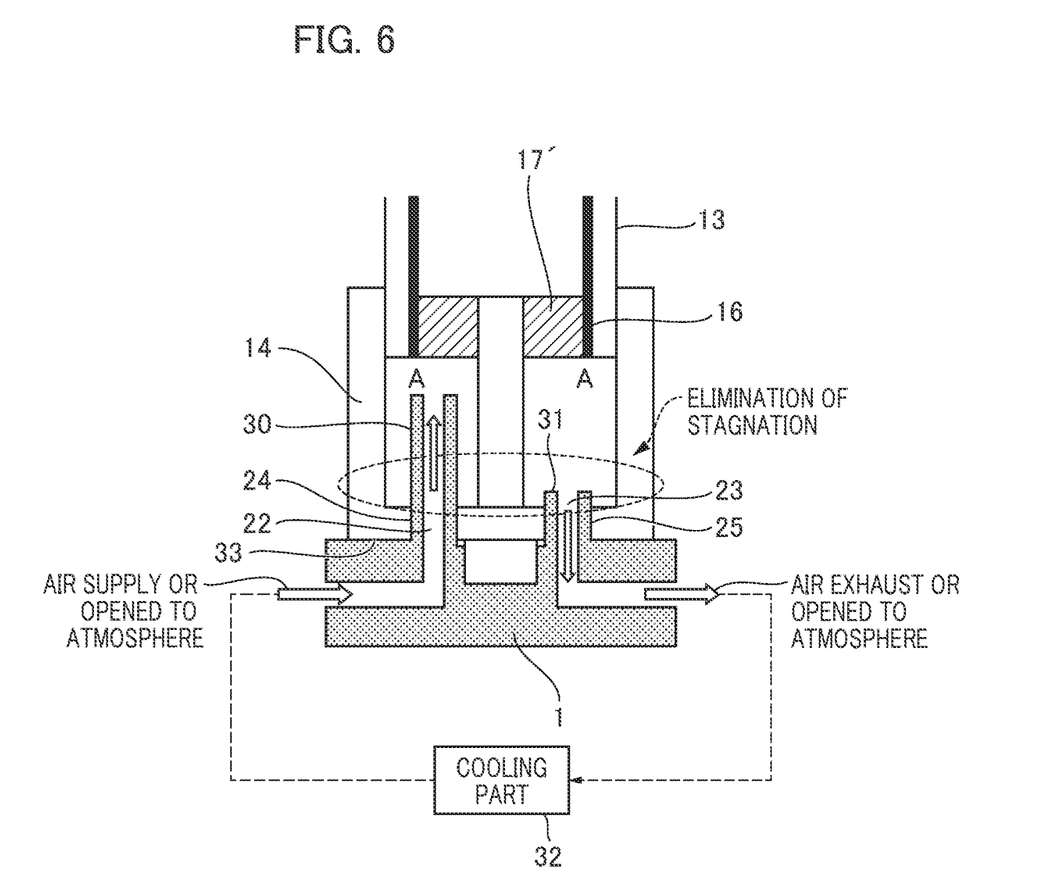
FIG. 6 is a diagram illustrating another example of a shape of the base part and a piping system in the embodiment.

FIG. 6 is a diagram illustrating another example of the shape of the base part and the piping system in the embodiment, and as illustrated in FIG. 6, a height of the air exhaust ventilation pipe 31 of the holding part 1 may be lower than that of the air supply ventilation pipe 30. That is to say, an amount of protrusion of the air exhaust ventilation pipe into the base part may be smaller than an amount of protrusion of the air supply ventilation pipe into the base part. Thus, the stagnation of air on the lower side inside the base part of FIG. 6 can be reduced.

With regard to air supply and air exhaust using the cooling part 32, for example, although the cooling effect is reduced, one of them may communicate with the atmosphere (may be opened to the atmosphere).

For example, although one piping line may be selectively used for both air supply and air exhaust, in this case, the design such as the configuration of the piping system and the configuration of the control system which takes charge of gas control tends to be complicated and the manufacturing costs tend to be increased.

Therefore, the configuration can be simplified by configuring the air supply and the air exhaust of the piping line in accordance with the required cooling performance, for example, the air supply side is opened to the atmosphere or the air exhaust side is opened to the atmosphere.

Also, in the configuration of this embodiment, the protrusion-shaped air supply ventilation pipe or the protrusion-shaped air exhaust ventilation pipe also serves as the above-described alignment mechanism. Therefore, it is not necessary to separately provide the alignment mechanism as in Patent Document 2 and the mechanism can be simplified and the design difficulty can be reduced.

Furthermore, the manufacturing costs of the exposure apparatus and the mercury lamp can be reduced.

In the embodiment of FIGS. 4 and 6, a height of a surface at a lower end of the metal member 16 is equal to that of (has the same height as) a surface at a lower end of the metal electrode core wire holding body 17'. However, in order to increase an area of a portion to be cooled of the metal member 16, the surface at the lower end of the metal member 16 may further protrude in a downward side of FIG. 6 than the surface at the lower end of the metal electrode core wire holding body 17'. In this case, it is desirable in terms of strength that a surface at a lower end of the tubular sealing part 13 be configured to be at the same height as the surface at the lower end of the metal member 16 or be located below the surface at the lower end of the metal member 16.

A method for manufacturing an article (a semiconductor IC element, a liquid crystal display element, an MEMS, or the like) in this embodiment using the exposure apparatus described above will be described below.

The article in this embodiment has a pattern forming step of forming a pattern by exposing a substrate (a wafer, a glass substrate, or the like) coated with a photosensitizer to light using the exposure apparatus described above. Furthermore, the article is manufactured using a step of developing the substrate (a photosensitive agent) on which a pattern is formed using the pattern forming step and a step of treating the developed substrate using another well-known step.

Other well-known steps include etching, resist stripping, dicing, bonding, packaging, and the like.

In this way, according to the article manufacturing method to which this embodiment is applied, the lifespan of the lamp of the exposure apparatus is increased so that the yield can be improved and the reliability can be improved.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-090470 filed on May 25, 2020, which is hereby incorporated by reference herein in its entirety.

What is claimed is:

1. An exposure apparatus comprising a holding part configured to hold an electric discharge lamp,
   wherein the electric discharge lamp includes an electric discharge tube which covers an electric discharge space in which a pair of electrodes are disposed to face each other, a socket provided on at least one end portion side of the electric discharge tube, a metal member which guides at least one of the pair of electrodes into the socket, wherein an opening for ventilation is provided in a bottom surface of the socket on an end portion side,
   wherein the holding part includes an air supply ventilation pipe and an air exhaust ventilation pipe, and the air supply ventilation pipe and the air exhaust ventilation pipe are configured to form a path for ventilation through the opening in the bottom surface of the socket and to be inserted into the socket in a state in which the holding part holds the electric discharge lamp, and wherein the exposure apparatus includes a cooling part which cools the metal member by supplying a cooling medium to the metal member in the socket through the air supply ventilation pipe and exhausting the cooling medium in the socket through the air exhaust ventilation pipe.

2. The exposure apparatus according to claim 1, wherein an opening of the air supply ventilation pipe is configured to face the metal member in the socket in a state in which the holding part holds the electric discharge lamp.

3. The exposure apparatus according to claim 1, wherein an opening of the air supply ventilation pipe is arranged along a circumferential position of the socket in a state in which the holding part holds the electric discharge lamp.

4. The exposure apparatus according to claim 1, wherein an opening of the air supply ventilation pipe has a shape elongated along a circumferential direction of the socket.

5. The exposure apparatus according to claim 1, wherein an opening of the air exhaust ventilation pipe is disposed further inward in the socket than an opening of the air supply ventilation pipe in a state in which the holding part holds the electric discharge lamp.

6. The exposure apparatus according to claim 1, wherein an amount of protrusion of the air exhaust ventilation pipe into the socket is smaller than an amount of protrusion of the air supply ventilation pipe into the socket.

7. The exposure apparatus according to claim 1, wherein the metal member is disposed in a circumferential direction inside the socket.

8. The exposure apparatus according to claim 1, wherein the air supply ventilation pipe and the air exhaust ventilation pipe position the electric discharge lamp by the ventilation pipe being fitted into the opening for ventilation in the bottom surface of the socket.

9. The exposure apparatus according to claim 1, wherein the ventilation pipe has an opening having a shape in accordance with the cooling characteristics of an electric discharge tube lamp to be installed.

10. The exposure apparatus according to claim 1, wherein one of the air supply ventilation pipe and the air exhaust ventilation pipe communicates with the atmosphere.

11. An article manufacturing method for manufacturing an article using an exposure apparatus, in which the exposure apparatus includes a holding part configured to hold an electric discharge lamp;

the electric discharge lamp includes an electric discharge tube configured to cover an electric discharge space in which a pair of electrodes are disposed to face each other, a socket provided on at least one end portion side of the electric discharge tube, a metal member which guides at least one of the pair of electrodes into the socket, wherein an opening for ventilation is provided in a bottom surface of the socket on an end portion side;

the holding part includes an air supply ventilation pipe and an air exhaust ventilation pipe, and the air supply ventilation pipe and the air exhaust ventilation pipe are configured to form a path for ventilation through the opening in the bottom surface of the socket and to be inserted into the socket in a state in which the holding part holds the electric discharge lamp; and wherein the exposure apparatus includes a cooling part which cools the metal member by supplying a cooling medium to the metal member in the socket using the air supply ventilation pipe and exhausting the cooling medium in the socket through the air exhaust ventilation pipe is provided, comprising:

a pattern forming step of forming a pattern on a substrate using the exposure apparatus; and a step of developing the substrate on which a pattern is formed through the pattern forming step.

* * * * *